(12) United States Patent
Ozaki et al.

(10) Patent No.: US 7,887,637 B2
(45) Date of Patent: Feb. 15, 2011

(54) METHOD FOR CLEANING TREATMENT CHAMBER IN SUBSTRATE TREATING APPARATUS AND METHOD FOR DETECTING ENDPOINT OF CLEANING

(75) Inventors: Shigenori Ozaki, Amagasaki (JP); Hideyuki Noguchi, Nirasaki (JP); Yoshiro Kabe, Amagasaki (JP); Kazuhiro Isa, Amagasaki (JP); Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1041 days.

(21) Appl. No.: 10/589,511

(22) PCT Filed: Feb. 17, 2005

(86) PCT No.: PCT/JP2005/002394

§ 371 (c)(1),
(2), (4) Date: Aug. 15, 2006

(87) PCT Pub. No.: WO2005/081302

PCT Pub. Date: Sep. 1, 2005

(65) Prior Publication Data

US 2007/0163617 A1 Jul. 19, 2007

(30) Foreign Application Priority Data

Feb. 19, 2004 (JP) .............................. 2004-043449
Nov. 10, 2004 (JP) .............................. 2004-326316
Nov. 18, 2004 (JP) .............................. 2004-334552

(51) Int. Cl.
*C25F 1/00* (2006.01)
*C25F 3/30* (2006.01)
*C25F 5/00* (2006.01)

(52) U.S. Cl. .......................... 134/1.1; 134/22.1; 216/67
(58) Field of Classification Search ....................... None
See application file for complete search history.

(56) References Cited

U.S. PATENT DOCUMENTS

| 5,861,601 | A * | 1/1999 | Sato et al. .............. 219/121.43 |
| 6,613,682 | B1 * | 9/2003 | Jain et al. .................... 438/706 |
| 6,872,323 | B1 * | 3/2005 | Entley et al. .................. 216/67 |
| 6,914,927 | B2 * | 7/2005 | Watson et al. ................. 372/58 |
| 2002/0155714 | A1 * | 10/2002 | Suzuki ....................... 438/689 |
| 2003/0127118 | A1 * | 7/2003 | Itano ............................ 134/37 |
| 2004/0043626 | A1 * | 3/2004 | Chou San et al. .......... 438/758 |

FOREIGN PATENT DOCUMENTS

| JP | 5 102089 | 4/1993 |
| JP | 8 92769 | 4/1996 |
| JP | 9 249975 | 9/1997 |
| JP | 2000 294550 | 10/2000 |
| JP | 2001 15398 | 1/2001 |
| JP | 2001 127280 | 5/2001 |
| JP | 2001 250818 | 9/2001 |

\* cited by examiner

*Primary Examiner*—Duy-Vu N Deo
(74) *Attorney, Agent, or Firm*—Oblon, Spivak, McClelland, Maier & Neustadt, L.L.P.

(57) ABSTRACT

In a substrate processing apparatus for performing a plasma process on a substrate including a tungsten-containing film, cleaning is performed for a process chamber. This cleaning includes, after the plasma process, supplying a gas containing $O_2$ into the process chamber without setting the process chamber opened to the atmosphere, and generating plasma of the gas to clean the process chamber.

25 Claims, 10 Drawing Sheets

METHOD FOR CLEANING TREATMENT CHAMBER IN SUBSTRATE TREATING APPARATUS AND METHOD FOR DETECTING ENDPOINT OF CLEANING

TECHNICAL FIELD

The present invention relates to a method for cleaning a process chamber and a method for detecting the cleaning end point, in a substrate processing apparatus. More specifically, the present invention relates to a method for cleaning a process chamber contaminated with metal and a method for detecting the cleaning end point. Further, the present invention relates to a computer program and a storage medium for executing the method.

BACKGROUND ART

In recent years, owing to the demands for higher integration degrees and higher operation rates of LSIs, design rules for semiconductor devices of LSIs are increasingly miniaturized. Along with this trend, the resistivity of transistor gate electrodes used in DRAMs or the like is required to be lower. Accordingly, tungsten (W)-containing films with a low resistivity have come into use for gate electrodes of this kind. For example, a tungsten polycide gate (a multi-layered film of WSi/poly-Si) and a tungsten poly-metal gate (a multi-layered structure of W/WN/poly-Si) with a lower resistivity have attracted attention.

On the other hand, where the tungsten polycide or tungsten poly-metal gate is utilized in a process of manufacturing a gate electrode, the process includes a step of performing selective oxidation of poly-silicon on the side surface of the gate electrode. At this time, in order to perform the selective oxidation of poly-silicon while suppressing generation of tungsten oxide, a microwave plasma processing apparatus of the RLSA (Radial Line Slot Antenna) type is used for this step, because it allows the process to be performed at a low temperature by plasma having a high plasma density and a low electron temperature (for example, Patent Document 1).

In a process of this kind, an Si wafer including tungsten is handled, and thus the process chamber used for the process is contaminated with tungsten. If this process chamber is used for subsequent selective oxidation, tungsten affects the process such that tungsten may be taken into devices as contaminants, and tungsten may hinder the oxidation process and decrease the oxidation rate. Accordingly, it is necessary to perform cleaning of the process chamber used for the process, so as to decrease the contamination level thereof to an acceptable level for manufacturing semiconductor devices.

Conventionally, where cleaning is performed for a process chamber contaminated with tungsten (W), the process chamber is first opened to the atmosphere. Then, components inside the chamber are subjected to wet cleaning by an acid or the like, and further the inner wall of the vacuum chamber is cleaned up by a wiper impregnated with acid, water, or solvent.

However, this cleaning requires a time period for setting the process chamber opened to the atmosphere, a time period for performing the wet cleaning, a time period for performing re-exhaust, a time period for re-conditioning the process chamber after the exhaust, and so forth. These periods sum up into several hours and account for a decrease in throughput.

On the other hand, a dry cleaning method using plasma is also under review. The dry cleaning method using plasma is typically a method of turning a cleaning gas into plasma to remove deposits from inside a chamber.

However, conventionally, it has not yet been successful in utilizing dry cleaning to efficiently clean a process chamber contaminated with metal, such as tungsten (W).

Further, the end point of dry cleaning is difficult to find, and thus time management is utilized to determine the end of cleaning. However, since time management is arranged to terminate cleaning with reference to a preset time, a problem arises such that the cleaning is insufficient or the cleaning time period is too long. If the cleaning is insufficient, troublesome re-cleaning has to be performed, because deposits remaining in a chamber cause contamination. If the cleaning time period is too long, time and energy are wastefully consumed.

Patent Document 1: Jpn. Pat. Appln. KOKAI Publication No. 2000-294550

DISCLOSURE OF INVENTION

An object of the present invention is to provide a method for cleaning a process chamber contaminated with metal, such as tungsten, in a substrate processing apparatus, which can efficiently clean the process chamber.

Another object of the present invention is to provide a method for cleaning and a method for detecting the cleaning end point, which can find the end point in a simple way, when cleaning a process chamber contaminated with metal, such as tungsten, in a substrate processing apparatus.

According to a first aspect of the present invention, there is provided a cleaning method for cleaning a process chamber contaminated with metal in a substrate processing apparatus for performing a vacuum process on a substrate, the method comprising: after the process, supplying a gas containing $O_2$ into the process chamber without setting the process chamber opened to the atmosphere, and generating plasma of the gas to clean the process chamber.

According to a second aspect of the present invention, there is provided a cleaning method for cleaning a process chamber in a substrate processing apparatus for performing a plasma process on a substrate having a metal-containing film, the method comprising: after the process, supplying a gas containing $O_2$ into the process chamber without setting the process chamber opened to the atmosphere, and generating plasma of the gas to clean the process chamber.

In the first aspect, the process on the substrate may be an oxidation process on a substrate containing metal. One of the typical examples of the metal is tungsten. The process on the substrate may be a plasma process.

In the second aspect, the metal-containing film may be a tungsten-containing film. A specific example of the plasma process may be a selective oxidation process on a gate electrode including a tungsten-containing film and a poly-silicon film.

In the first aspect applied to a plasma process and in the second aspect, the plasma process on the substrate and the cleaning may be performed by plasma generated by a planar antenna or plasma generated by an inductive coupling type. The plasma process on the substrate and the cleaning are preferably performed by plasma generated by microwaves supplied into the process chamber through a planar antenna having a plurality of slots.

In the first and second aspects, the cleaning may be performed by plasma of $O_2$ gas alone, plasma of $O_2$ gas and an inactive gas, or plasma of $O_2$ gas and $H_2$ gas and an inactive gas. In this case, the cleaning is performed by plasma preferably having a ratio of $H_2$ gas relative to $O_2$ gas set at 4 or more, and most preferably at 8. The cleaning is preferably performed while temperature inside the process chamber is set at about 600° C. Further, the cleaning is preferably performed while pressure inside the process chamber is set to be 67 Pa or less.

Furthermore, the cleaning may be performed while alternately generating plasma of $O_2$ gas and an inactive gas, and plasma of $O_2$ gas, $H_2$ gas, and an inactive gas. The process chamber may be heated by plasma prior to the cleaning. The substrate processing apparatus is preferably arranged such that at least a part of a surface exposed to plasma is made of a dielectric material in the process chamber.

According to a third aspect of the present invention, there is provided a computer program for execution on a computer, which, when executed by the computer, controls a substrate processing apparatus for performing a plasma process on a substrate having a metal-containing film, so as to execute a cleaning method for cleaning a process chamber in the substrate processing apparatus, wherein the method comprises, after the process, supplying a gas containing $O_2$ into the process chamber without setting the process chamber opened to the atmosphere, and generating plasma of the gas to clean the process chamber.

According to a fourth aspect of the present invention, there is provided a storage medium that stores a control program for execution on a computer, which, when executed by the computer, controls a substrate processing apparatus for performing a plasma process on a substrate having a metal-containing film, so as to execute a cleaning method for cleaning a process chamber in the substrate processing apparatus, wherein the method comprises, after the process, supplying a gas containing $O_2$ into the process chamber without setting the process chamber opened to the atmosphere, and generating plasma of the gas to clean the process chamber.

According to a fifth aspect of the present invention, there is provided a plasma processing apparatus comprising: a plasma supply source configured to generate plasma; a process container that defines a process chamber for performing a process on a substrate by the plasma; a substrate table configured to place the substrate thereon within the process container; exhaust means for decreasing pressure inside the process container; gas supply means for supplying a gas into the process container; and a control section configured to conduct control to execute a cleaning method for cleaning a process chamber in a substrate processing apparatus for performing a plasma process on a substrate having a metal-containing film, wherein the method comprises, after the process, supplying a gas containing $O_2$ into the process chamber without setting the process chamber opened to the atmosphere, and generating plasma of the gas to clean the process chamber.

According to a sixth aspect of the present invention, there is provided a substrate processing method comprising: cleaning a process chamber in a substrate processing apparatus for performing a plasma process on a substrate having a metal-containing film, wherein the cleaning comprises, after the process, supplying a gas containing $O_2$ into the process chamber without setting the process chamber opened to the atmosphere, and generating plasma of the gas to clean the process chamber; and performing a plasma process on a substrate within the process chamber after the cleaning.

According to a seventh aspect of the present invention, there is provided a cleaning end point detecting method for detecting a cleaning end point when cleaning a process chamber by plasma of a cleaning gas in a plasma processing apparatus for performing a process on a substrate having a metal-containing film, the method comprising: measuring emission intensity of radicals that increase with progress of cleaning within the process chamber, and detecting a cleaning end point from values thus obtained.

In the seventh aspect, it is preferable that the cleaning gas is a gas containing hydrogen gas and an inactive gas, and the radicals are hydrogen radicals. The process on the substrate is preferably an oxidation process on a substrate including the metal-containing film. The metal-containing film is preferably a tungsten-containing film. The oxidation process on the substrate including the tungsten-containing film is preferably a selective oxidation process on a poly-silicon film of a laminated film including the tungsten-containing film and the poly-silicon film. The selective oxidation process and the cleaning are preferably performed by plasma generated by an inductive coupling type, plasma generated by a parallel-plate type, or plasma generated by a planar antenna type, or performed by plasma generated by microwaves supplied into the process chamber through a planar antenna having a plurality of slots.

According to an eighth aspect of the present invention, there is provided a cleaning method for cleaning a process chamber by plasma of a cleaning gas in a plasma processing apparatus for performing a process on a substrate having a metal-containing film formed thereon, the method comprising: measuring emission intensity of radicals that increase with progress of cleaning within the process chamber, and detecting a cleaning end point from values thus obtained.

In the cleaning method according to the eighth aspect, the metal-containing film is preferably a tungsten-containing film. The method preferably comprises, after the process on the substrate, supplying a cleaning gas into the process chamber without setting the process chamber opened to the atmosphere, and generating plasma of the cleaning gas to clean the process chamber. The cleaning is preferably performed by plasma generated by an inductive coupling type, plasma generated by a parallel-plate type, or plasma generated by a planar antenna type, or performed by plasma generated by microwaves supplied into the process chamber through a planar antenna having a plurality of slots.

According to a ninth aspect of the present invention, there is provided a control program for execution on a computer, which, when executed by the computer, controls a plasma processing apparatus for performing a process on a substrate having a metal-containing film formed thereon, so as to execute a cleaning method for cleaning a process chamber in the plasma processing apparatus, wherein the method comprises measuring emission intensity of radicals that increase with progress of cleaning within the process chamber, and detecting a cleaning end point from values thus obtained.

According to a tenth aspect of the present invention, there is provided a computer storage medium that stores a control program for execution on a computer, which, when executed by the computer, controls a plasma processing apparatus for performing a process on a substrate having a metal-containing film formed thereon, so as to execute a cleaning method for cleaning a process chamber in the plasma processing apparatus, wherein the method comprises measuring emission intensity of radicals that increase with progress of cleaning within the process chamber, and detecting a cleaning end point from values thus obtained.

According to an eleventh aspect of the present invention, there is provided a plasma processing apparatus comprising: a plasma supply source configured to generate plasma; a process container that defines a process chamber for performing a process on a substrate by the plasma; a substrate table configured to place the substrate thereon within the process container; exhaust means for decreasing pressure inside the process container; gas supply means for supplying a gas into the process container; and a control section configured to conduct control to execute a cleaning method for cleaning a process chamber in a plasma processing apparatus for performing a process on a substrate having a metal-containing film formed thereon, wherein the method comprises measuring emission intensity of radicals that increase with progress of cleaning within the process chamber, and detecting a cleaning end point from values thus obtained.

According to the present invention, after a process chamber is contaminated with metal by performing a plasma process or the like on a substrate having a metal-containing film, the chamber is treated in-situ by plasma of a gas containing $O_2$, without setting the chamber opened to the atmosphere. With this arrangement, metal components, such as tungsten, are oxidized and thereby sublimated, so the metal components, such as tungsten, are very effectively removed. Consequently, the cleaning time is significantly shortened, as compared to the conventionally cleaning process that requires a time period for setting the process chamber opened to the atmosphere, a time period for performing wet cleaning, a time period for performing re-exhaust, a time period for re-conditioning the process chamber after the exhaust, and so forth.

Further, according to the present invention, when dry cleaning is performed by plasma inside a chamber contaminated with tungsten, the emission intensity of hydrogen radical (H*) is monitored, so that the tungsten contamination quantity becomes easy to find. With this arrangement, the end point of the dry cleaning by plasma can be reliably determined. Consequently, it is possible to solve problems of the conventional cleaning method utilizing time management, such as contamination and re-cleaning due to insufficient cleaning, and excessive cleaning.

BEST MODE FOR CARRYING OUT THE INVENTION

Embodiments of the present invention will now be described with reference to the accompanying drawings.

Figure 1:
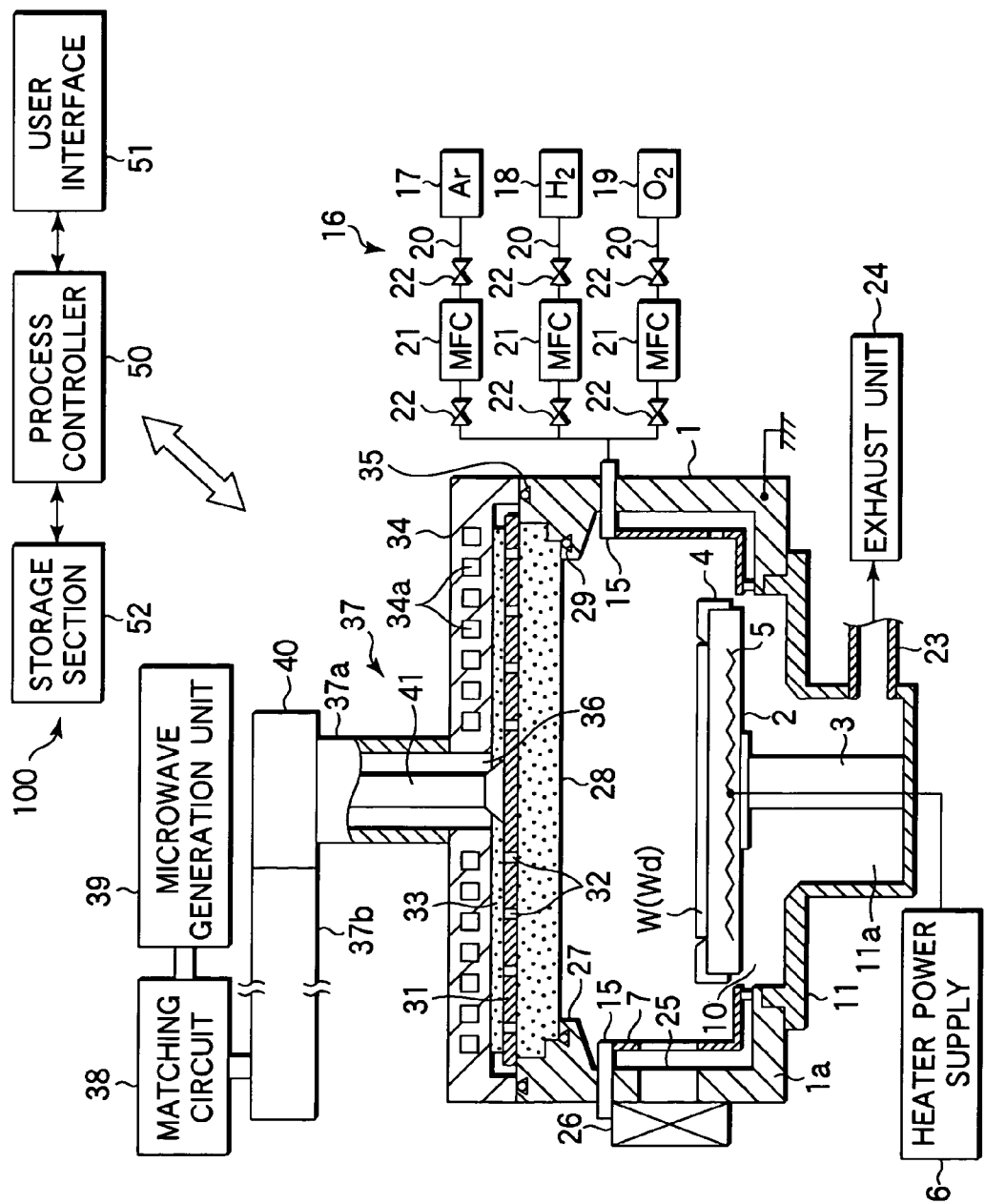
FIG. 1 is a sectional view schematically showing an example of a plasma processing apparatus to be subjected to a process chamber cleaning method according to a first embodiment of the present invention.

FIG. 1 is a sectional view schematically showing an example of a plasma processing apparatus to be subjected to a process chamber cleaning method according to a first embodiment of the present invention.

This microwave plasma processing apparatus 100 is arranged as a microwave plasma processing apparatus of the RLSA (Radial Line Slot Antenna) type, in which an RLSA, i.e., a planar antenna having a plurality of slots formed with a predetermined pattern, is utilized to radiate microwaves guided from a microwave generation unit into a chamber to generate plasma. For example, this apparatus is used to perform a selective oxidation process on a poly-silicon sidewall of a gate electrode.

This plasma processing apparatus 100 includes an essentially cylindrical chamber 1, which is airtight and grounded. The bottom wall 1a of the chamber 1 has a circular opening 10 formed essentially at the center, and is provided with an exhaust chamber 11 communicating with the opening 10 and extending downward. The chamber 1 is provided with a susceptor 2 disposed therein and made of a ceramic, such as AlN, for supporting a target substrate, such as a wafer W or dummy wafer Wd, in a horizontal state. The susceptor 2 is supported by a cylindrical support member 3 made of a ceramic, such as AlN, and extending upward from the center of the bottom of the exhaust chamber 11. The susceptor 2 is provided with a guide ring 4 disposed on the outer edge to guide the wafer W. The susceptor 2 is further provided with a heater 5 of the resistance heating type built therein. The heater 5 is supplied with a power from a heater power supply 6 to heat the susceptor 2, thereby heating the target object or wafer W. For example, the heater 5 can control the temperature within a range of from room temperature of the wafer to 800° C. A cylindrical liner 7, made of a dielectric material, such as quartz, is disposed along the inner wall of the chamber 1.

The susceptor 2 is provided with wafer support pins (not shown) that can project and retreat relative to the surface of the susceptor 2 to support the wafer W and move it up and down.

A gas feeding member 15 having an annular structure is disposed on the sidewall of the chamber 1, and is connected to a gas supply system 16. The gas feed member may have a shower structure. The gas supply system 16 includes an Ar gas supply source 17, an $H_2$ gas supply source 18, and an $O_2$ gas supply source 19, from which gases are supplied through respective gas lines 20 to the gas feeding member 15 and are delivered from the gas feeding member 15 into the chamber 1. Each of the gas lines 20 is provided with a mass-flow controller 21 and two switching valves 22 one on either side of the controller 21.

The sidewall of the exhaust chamber 11 is connected to an exhaust unit 24 including a high speed vacuum pump through an exhaust line 23. The exhaust unit 24 can be operated to uniformly exhaust the gas from inside the chamber 1 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W or dummy wafer Wd is transferred between the plasma processing apparatus 100 and an adjacent transfer chamber (not shown) through the transfer port 25.

The top of the chamber 1 is opened and is provided with an annular support portion 27 projecting along the periphery of the opening. A microwave transmission plate 28 is airtightly disposed on the support portion 27 through a seal member 29. The microwave transmission plate 28 is made of a dielectric material, such as quartz or a ceramic, e.g., $Al_2O_3$, to transmit microwaves. The interior of the chamber 1 is thus held airtight.

Figure 2:
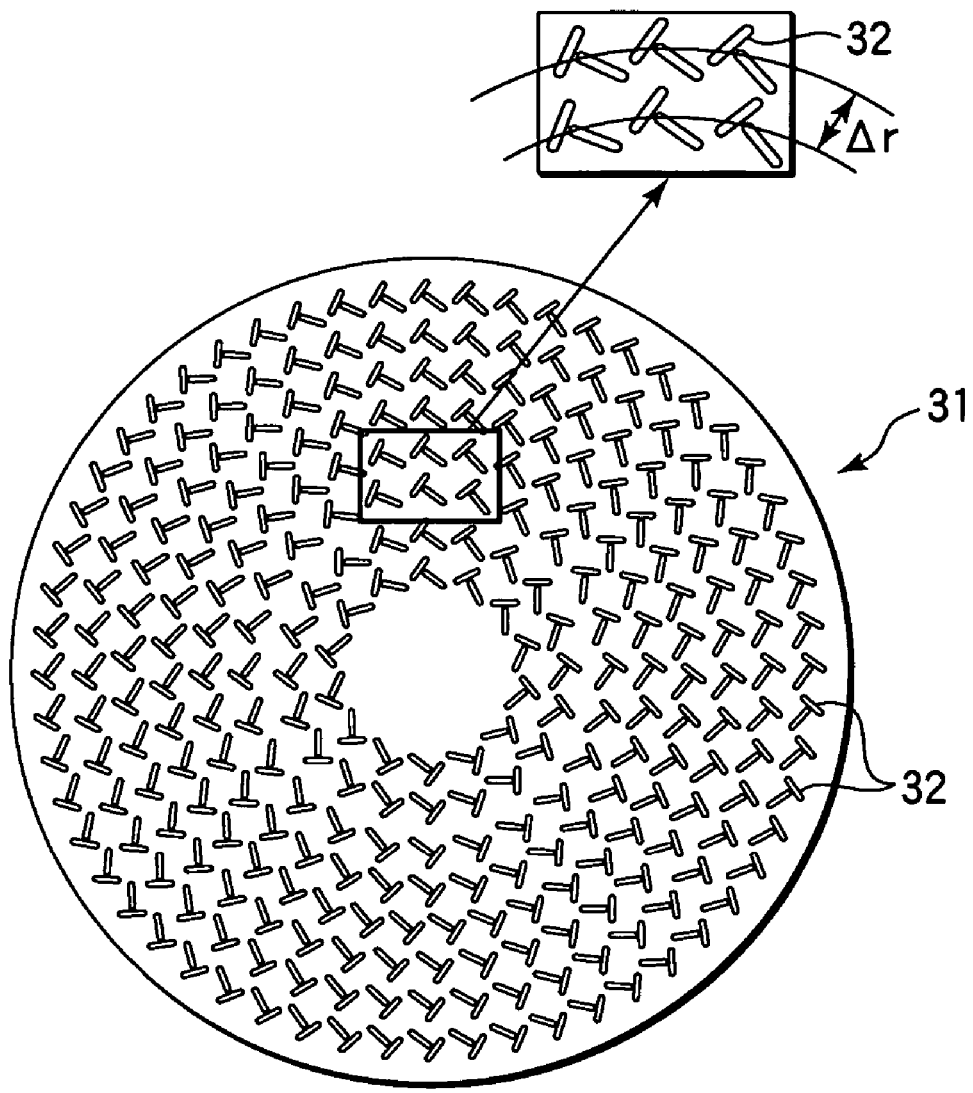
FIG. 2 is a view showing the structure of a planar antenna member used in the microwave plasma processing apparatus shown in FIG. 1.

A circular planar antenna member 31 is disposed above the microwave transmission plate 28 to face the susceptor 2. The planar antenna member 31 is attached on the top of the support portion 27. The planar antenna member 31 is formed of a conductive body, such as a copper plate or aluminum plate with the surface plated with gold. The planar antenna member 31 has a plurality of microwave radiation holes (slots) 32 penetrating therethrough and formed in a predetermined pattern. For example, as shown in FIG. 2, the microwave radiation holes 32 are formed of slits, wherein adjacent microwave radiation holes 32 intersect with each other, and, typically, they are set perpendicular to each other (to form a T-shape), as shown in the drawings. The plurality of microwave radiation holes 32 are arrayed concentrically. Accordingly, the planar antenna member 31 is arranged to form an RLSA antenna. The length and array intervals of the microwave radiation holes 32 are determined in accordance with the wavelength of microwaves and so forth. The microwave radiation holes 32 may have another shape, such as a circular shape or arc shape. The array pattern of the microwave radiation holes 32 is not limited to a specific one, and, for example, it may be spiral or radial other than concentric.

A retardation member 33 made of a dielectric material with a dielectric constant larger than that of vacuum is disposed on the top of the planar antenna member 31.

The planar antenna member 31 and retardation member 33 are covered with a shield cover 34 disposed at the top of the chamber 1 and made of a metal material, such as aluminum or stainless steel. A seal member 35 is interposed between the top of the chamber 1 and the shield cover 34 to seal this portion. The shield cover 34 is provided with cooling water passages 34a formed therein. The shield cover 34 is grounded.

The shield cover 34 has an opening 36 formed at the center of the upper wall and connected to a wave guide 37. The wave guide 37 is connected to a microwave generation unit 39 at one end through a matching circuit 38. The microwave generation unit 39 generates microwaves with a frequency of, e.g., 2.45 GHz, which are transmitted through the wave guide 37 to the planar antenna member 31. The microwaves may have a frequency of 8.35 GHz or 1.98 GHz.

The wave guide 37 includes a coaxial wave guide 37a having a circular cross-section and extending upward from the opening 36 of the shield cover 34, and a rectangular wave guide 37b having a rectangular cross-section and extending in a horizontal direction. These wave guides are connected through a mode transducer 40. The coaxial wave guide 37a includes an inner conductive body 41 extending at the center, which is connected and fixed to the center of the planar antenna member 31 at the lower end.

The respective components of the plasma processing apparatus 100 are connected to and controlled by a process controller 50. The process controller 50 is connected to a user interface 51 including, e.g. a keyboard and a display, wherein the keyboard is used for a process operator to input commands for operating the plasma processing apparatus 100, and the display is used for showing visualized images of the operational status of the plasma processing apparatus 100.

Further, the process controller 50 is connected to a storage section 52 that stores control programs for the process controller 50 to control the plasma processing apparatus 100 so as to perform various processes, and programs or recipes for respective components of the plasma processing apparatus 100 to perform processes in accordance with process conditions. Recipes may be stored in a hard disk or semiconductor memory, or stored in a portable storage medium, such as a CDROM or DVD, to be attached to a predetermined position in the storage section 52. Further, recipes may be transmitted from another apparatus through, e.g., a dedicated line, as needed.

A required recipe is retrieved from the storage section 52 and executed by the process controller 50 in accordance with an instruction or the like through the user interface 51. As a consequence, the plasma processing apparatus 100 can perform a predetermined process under the control of the process controller 50.

Figure 3A:
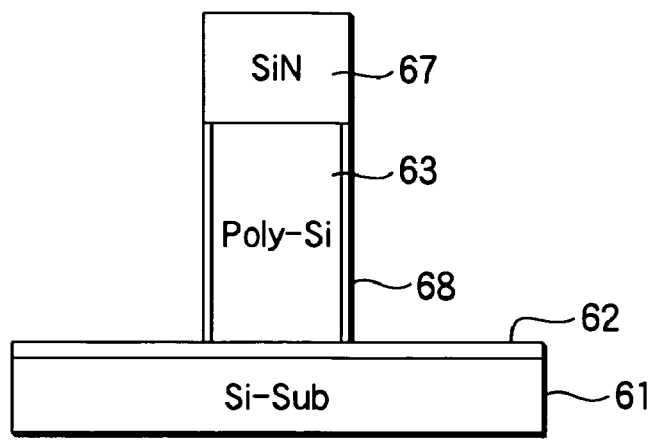
FIG. 3A is a view schematically showing the structure of a conventional gate electrode made of poly-silicon.
Figure 3B:
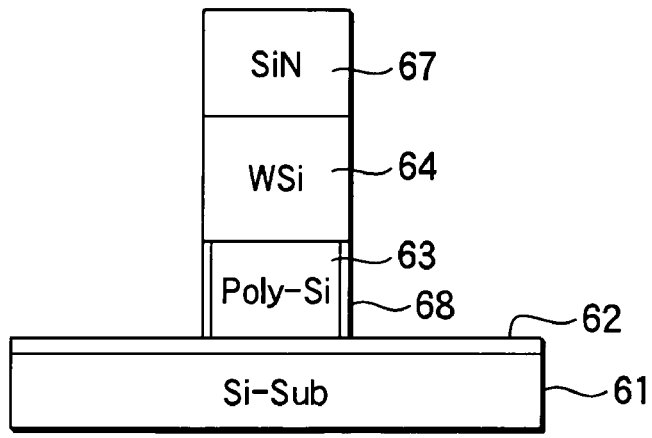
FIG. 3B is a view showing an example of the structure of a gate electrode including a W-containing film in relation to an embodiment of the present invention.
Figure 3C:
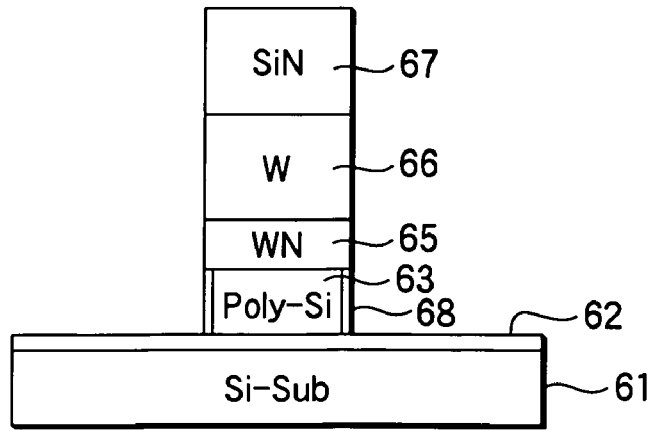
FIG. 3C is a view showing another example of the structure of a gate electrode including a W-containing film in relation to an embodiment of the present invention.

In the plasma processing apparatus 100 thus arranged, a selective oxidation process of a gate electrode is performed, as described above. Conventionally, as shown in FIG. 3A, a structure used as a gate electrode comprises a poly-silicon film 63 formed on an Si substrate 61 through a gate insulating film 62. However, owing to the demands for higher integration degrees and higher operation speed of LSIs, design rules are miniaturized, and the resistivity of gate electrodes is required to be lower. As a consequence, recently, gates with a structure utilizing tungsten (W) are often employed. One of the examples is a tungsten polycide structure shown in FIG. 3B, which comprises a poly-silicon film 63 formed on an Si substrate 61 through a gate insulating film 62 and a tungsten silicide (WSi) 64 formed on the poly-silicon film 63. Another example is a tungsten poly-metal gate structure with a lower resistivity shown in FIG. 3C, which comprises a poly-silicon film 63 formed on an Si substrate 61 through a gate insulating film 62, and a tungsten nitride (WN) film 65 and a tungsten (W) film 66 sequentially formed on the poly-silicon film 63. These structures require selective oxidation for oxidizing only the poly-silicon. In FIGS. 3A to 3C, the reference numeral 67 denotes a hard mask layer formed of, e.g., an SiN insulating film and used in etching the gate electrode, and the reference numeral 68 denotes an oxide film formed by the selective oxidation.

Of them, for example, the tungsten poly-metal gate electrode shown in FIG. 3C is fabricated in accordance with the following manufacturing steps. At first, a gate insulating film 62 is formed on an Si substrate 61 by, e.g., thermal oxidation. Then, a poly-silicon film 63, a tungsten nitride (WN) film 65, a tungsten (W) film 66, and a hard mask layer 67 are formed by CVD on the gate insulating film 62 in this order. Then, a photo-resist film (not shown) is formed thereon, and the hard mask layer 67 is etched by photolithography using the photo-resist film as a mask. Then, the tungsten (W) film 66, tungsten nitride (WN) film 65, and poly-silicon film 63 are etched in this order, using the photo-resist film and hard mask layer 67 or the hard mask layer 67 as a mask, to form a gate electrode structure. Then, a selective oxidation process is performed under the conditions described below to form an oxide film 68 at the surface of the sidewall of the poly-silicon film 63, thereby obtaining the structure shown in FIG. 3C.

When a selective oxidation process of a gate electrode is performed in the plasma processing apparatus 100, the gate valve 26 is first opened, and a wafer W having a gate electrode formed thereon is transferred through the transfer port 25 into the chamber 1 and placed on the susceptor 2.

Then, Ar gas, $H_2$ gas, and $O_2$ gas are supplied at predetermined flow rates from the Ar gas supply source 17, $H_2$ gas supply source 18, and $O_2$ gas supply source 19 in the gas supply system 16 through the gas feeding member 15 into the chamber 1, while it is maintained at a predetermined pressure. As conditions used at this time, the gas flow rate is set such that, e.g., Ar gas: 1,000 mL/min, $H_2$ gas: 200 mL/min, and $O_2$ gas: 100 mL/min, to make a high $H_2$ gas concentration, and the in-chamber pressure is set to be 3 to 700 Pa, such as 6.7 Pa (50 mTorr).

Then, microwaves are supplied from the microwave generation unit 39 through the matching circuit 38 into the wave guide 37. The microwaves are supplied through the rectangular wave guide 37b, mode transducer 40, and coaxial wave guide 37a in this order to the planar antenna member 31. Then, the microwaves are radiated from the planar antenna member 31 through the microwave transmission plate 28 into the space above the wafer W within the chamber 1.

When the microwaves are radiated from the planar antenna member 31 through the microwave transmission plate 28 into the chamber 1, $H_2$ gas, Ar gas, and $O_2$ gas are turned into plasma within the chamber 1 by the microwaves. The plasma thus generated is used to perform selective oxidation at the surface of the poly-silicon sidewall of a gate electrode disposed on the wafer W. This microwave plasma has a plasma density of about $10^{11}/cm^3$ or more and a low electron temperature of about 0.5 to 2 eV. This plasma has merits such that a thin oxide film can be formed by a selective oxidation process at a low temperature and in a short time, and the underlying film can suffer less plasma damage due to ions and so forth. Further, where a gate electrode containing tungsten (W) is formed, as shown in FIG. 3B or 3C, a selective oxidation process of poly-silicon is performed with such high density plasma, at a low temperature and in a short time, while using a gas mixing of high flow ration of $H_2/O_2$. In this case, the process can be performed with very high accuracy, while sublimation of $WO_x$ ($WO_3$, $WO_2$, or WO) due to oxidation of tungsten (W) is suppressed as far as possible.

However, sublimation of $WO_x$ cannot be completely prevented, and thus the interior of the chamber 1 is contaminated with $WO_x$ thus sublimated. If the chamber 1 in this state is used to perform a selective oxidation process for a subsequent wafer, tungsten (W) deposited inside the chamber 1 may affect the process such that tungsten (W) is taken into devices as contaminants and the oxidation process is hindered by the tungsten (W). Accordingly, after the selective oxidation process, the chamber 1 needs to be cleaned to decrease the contamination level of tungsten (W) to the order of, e.g., $10^{11}$ atoms/cm² or less, and preferably to the order of $10^{10}$ atoms/cm² or less. A lower contamination level is more preferable.

In this embodiment, after a selective oxidation process is performed at the surface of the poly-silicon sidewall of a gate electrode containing tungsten (W), as described above, the chamber 1 contaminated with W is subjected to plasma dry cleaning without being opened to the atmosphere. Next, an explanation will be given of this cleaning process with reference to FIGS. 4A to 4D.

Figure 4A:
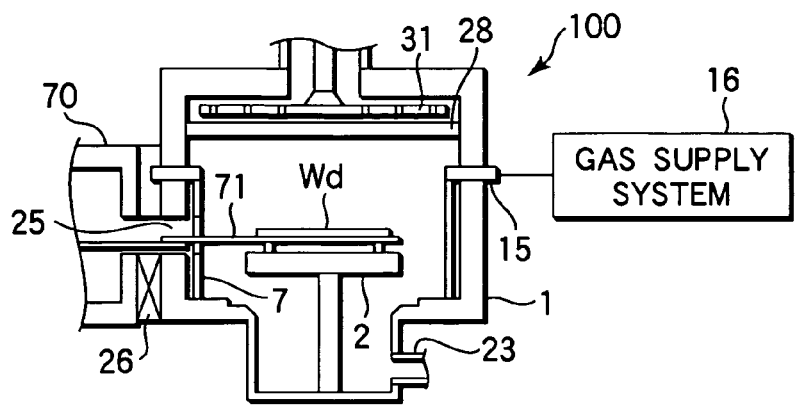
FIG. 4A is a view for explaining a cleaning method according to an embodiment of the present invention.

After the selective oxidation process, at first, as shown in FIG. 4A, the gate valve 26 is opened without being opened to the atmosphere. Then, a clean dummy wafer Wd is transferred by a transfer unit 71 from a transfer chamber 70 held in a vacuum state through the transfer port 25 into the chamber 1, and placed on the susceptor 2. This operation is performed to protect the susceptor 2 from plasma by the dummy wafer Wd, and to observe the surface of the dummy wafer Wd after the cleaning of the chamber 1, so as to examine an improved degree of contamination. This step is not indispensable, and no dummy wafer Wd may be placed on the susceptor 2 if the susceptor 2 does not require protection from damage.

Figure 4B:
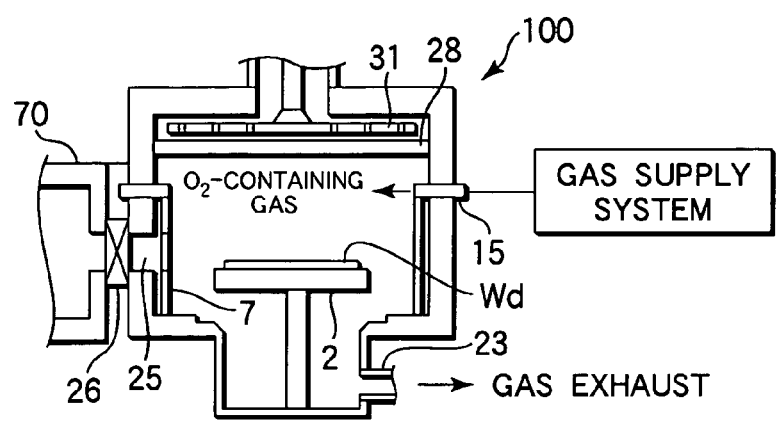
FIG. 4B is a view for explaining the cleaning method according to an embodiment of the present invention.
Figure 4C:
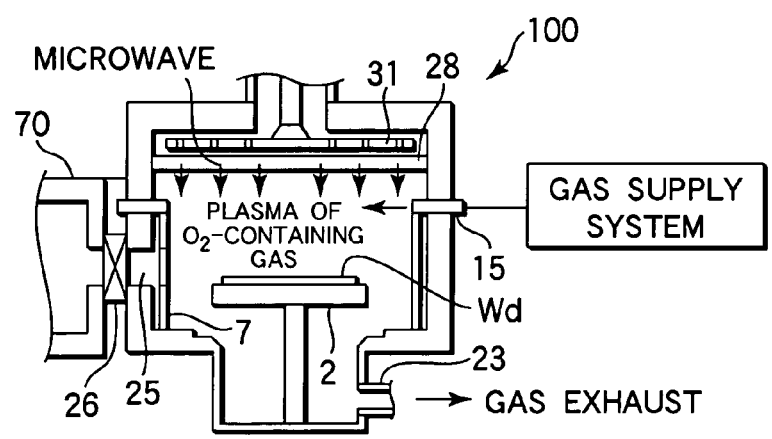
FIG. 4C is a view for explaining the cleaning method according to an embodiment of the present invention.
Figure 4D:
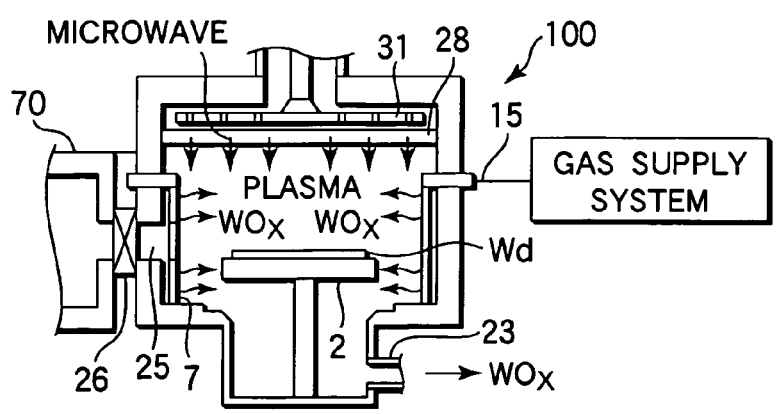
FIG. 4D is a view for explaining the cleaning method according to an embodiment of the present invention.

Then, as shown in FIG. 4B, while the interior of the chamber 1 is exhausted, a gas containing $O_2$ is supplied from the gas supply system 16 into the chamber 1. Then, as shown in FIG. 4C, microwaves are supplied from the microwave generation unit 39 into the chamber 1, as in the selective oxidation process of the surface of the poly-silicon sidewall, to turn the gas containing $O_2$ into plasma. Specifically, the microwaves are supplied from the microwave generation unit 39 through the matching circuit 38 into the wave guide 37. The microwaves are supplied through the rectangular wave guide 37b, mode transducer 40, coaxial wave guide 37a, and retardation member 33 in this order to the planar antenna member 31. Then, the microwaves are radiated from the slots of the planar antenna member 31 through the microwave transmission plate 28 into the chamber 1. With the microwaves thus radiated, the gas containing $O_2$ is turned into plasma in the chamber 1. Consequently, as shown in FIG. 4D, $WO_x$ deposited inside the chamber 1 is essentially sublimated by the plasma, and exhausted through the exhaust line 23, so the interior of the chamber 1 is cleaned. At this time, it is presumable that $H_2$ contained in the process gas can cause $WO_x$ to be more easily sublimated because $WO_x$ is deoxidized into a more unstable state, such as ions. This cleaning process is preferably performed every time the selective oxidation process of one device wafer is finished. Further, a seasoning process is preferably performed under the same conditions as the cleaning process, prior to the selective oxidation process. As a matter of course, the cleaning process may be performed after a plurality of device wafers are processed.

During this cleaning process, the pressure inside the chamber 1 is set to be, e.g., 3 to 1,333 Pa. This pressure is preferably set to be 3 to 67 Pa, such as 6.7 Pa. The temperature inside the chamber 1 (for example, the temperature of the susceptor 2) is preferably set to be 45° C. or more. The temperature of the susceptor 2 is preferably higher, and is more preferably set to be 200 to 800° C., and most preferably 400 to 800° C. The power of the microwave generation unit 39 is preferably set to be 1.0 to 5.0 kW.

The supplied gas containing $O_2$ may be formed only of $O_2$ gas. However, the gas is preferably formed of $O_2$ gas+Ar gas, and more preferably formed of $O_2$ gas+$H_2$ gas+Ar gas. Where the gas is formed only of $O_2$ gas, the flow rate thereof is preferably set to be 50 to 1,000 mL/min, and more preferably about 100 to 500 mL/min. If the flow rate of $O_2$ gas is too high, the plasma density is decreased and the cleaning effect thereby becomes lower. Where plasma of $O_2$ gas and Ar gas is used, if their flow rates are suitably adjusted, the cleaning effect can be made higher than a case where $O_2$ gas is solely used. This is so, because Ar gas thus added can increase the plasma density. In this case, the flow rates are preferably set such that $O_2$ gas: 10 to 500 mL/min, and Ar gas: 200 to 2,000 mL/min. Where plasma further containing a suitable amount of $H_2$ gas is used, the cleaning effect can be further improved. In the case of $O_2$ gas+$H_2$ gas+Ar gas, the flow rates are preferably set such that $O_2$ gas: 10 to 500 mL/min, Ar gas: 200 to 2,000 mL/min, and $H_2$ gas: 10 to 500 mL/min. The flow rate ratio of $H_2$ gas relative to $O_2$ gas is set to be 2 or more to enhance the cleaning effect. This ratio is preferably set to be 4 or more, and more preferably 6 or more.

Where supply of $O_2$ gas+Ar gas and supply of $O_2$ gas+$H_2$ gas+Ar gas are alternately repeated, e.g., $H_2$ gas is intermittently added to supply of $O_2$ gas+Ar gas, the cleaning effect is further improved. Further, where cleaning gas supply and one of vacuum-exhaust and vacuum-exhaust with purge gas supply are alternately repeated, the cleaning effect is further improved.

Furthermore, it is preferable that the apparatus shown in FIG. 1 is provided with a line for supplying He gas or Ne gas into the chamber 1, and plasma of He gas or Ne gas is generated within the chamber immediately before the cleaning condition plasma is generated. In this case, the temperature of the wall surface of the chamber 1 is increased by plasma heating in advance, so $WO_x$ can be more easily sublimated and the cleaning efficiency is thereby improved.

As described above, according to this embodiment, the chamber 1 is subjected to cleaning using plasma to remove tungsten (W) components on the chamber wall, without being opened to the atmosphere. Consequently, the cleaning time is significantly shortened, as compared to the conventionally wet cleaning process that requires a time period for setting a chamber opened to the atmosphere, a time period for performing the wet cleaning, a time period for performing re-exhaust, a time period for re-conditioning the process chamber after the exhaust, and so forth. For example, such an operation that conventionally requires at least two hours can be shortened to 2 to 30 minutes.

After the cleaning process is performed as described above, a plasma process, such as the selective oxidation process described above, is performed. Since this plasma process is performed in a clean state with a very low W contamination level, it is possible to avoid problems, such as inhibition of the selective oxidation process due to W contamination.

Next, an explanation will be given of an experiment conducted to confirm effects of this embodiment.

At first, various types of cleaning gases were used at various flow rates to confirm cleaning effects. In this experiment, an Si wafer (200 mm) having a W film formed on the entire surface was loaded into the chamber having no contamination with W in the apparatus shown in FIG. 1. Then, a cleaning process was simulated, while supplying each of $O_2$ gas alone, $O_2$ gas+Ar gas, and $O_2$ gas+$H_2$ gas+Ar gas into the chamber, at various flow rates. Further, the microwave generation unit was set at a power of 3.4 kW to supply microwaves into the chamber, the wafer temperature was set at 400° C., and the plasma was generated for 180 seconds. At this time, the temperature of the chamber wall was 45° C.

Then, the Si wafer having the W film was unloaded, and a clean bare Si wafer was loaded. Then, a plasma process was performed under the same conditions as those of selective oxidation of poly-silicon. Specifically, the gas flow rate: Ar/$H_2$/$O_2$=1,000/200/100 mL/min, the in-chamber pressure: 6.7 Pa, the microwave generation unit power: 3.4 kW, the susceptor temperature: 400° C., and the process time: 110 seconds.

Figure 5:
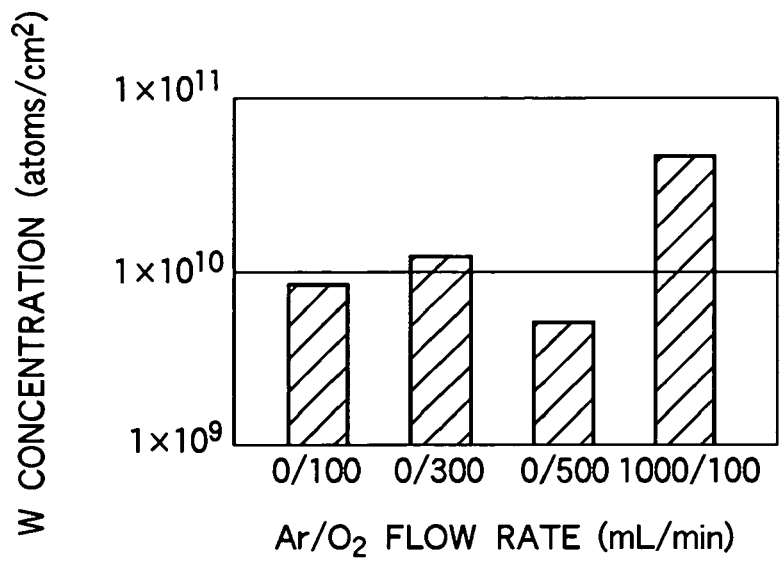
FIG. 5 is a view showing a result of an experiment on a change in W removal effect depending on gas composition.

Then, the bare Si wafer thus processed was unloaded, and the W contamination quantity on the surface was measured by a TXRF (Total Reflection X-Ray Fluorescence). It is thought that this W contamination quantity has a strong correlation with the amount of W removed from the wafer having the W film under the cleaning conditions described above, such that a larger amount of W thus removed stands for higher cleaning effect. Accordingly, the level of the cleaning effect was determined from the W contamination quantity. FIG. 5 shows a result of this experiment.

As shown in FIG. 5, where $O_2$ gas was used alone, the flow rate thereof was set at different values of 100, 300, and 500 mL/min. Of them, the cleaning effect was highest at 300 mL/min. It is though that this was so because, where $O_2$ gas was present too much, the plasma density was decreased and the $WO_x$ generation rate became lower. Where both of $O_2$ gas and Ar gas were supplied (Ar/$O_2$=1,000/100 mL/min), it was confirmed that the W concentration on the bare Si wafer was increased and thus the cleaning effect was higher, as compared to the case of $O_2$ gas used alone.

Next, an actual cleaning test was performed.

In this test, cleaning of the chamber of an apparatus having the structure shown in FIG. 1 was first performed to set the chamber in a W-free state. Then, seasoning inside the chamber was performed under the same conditions as those of the subsequent oxidation process. In this seasoning, at least one cycle of oxygen plasma generation and vacuum-exhaust was performed inside the chamber.

Thereafter, a first bare Si wafer for sampling was placed on the susceptor, and an oxidation process was performed under the same conditions as those of selective oxidation of poly-silicon. At this time, using the following conditions, an oxide film was formed to have a film thickness of 8 nm. Specifically, the gas flow rate: Ar/$H_2$/$O_2$=1,000/200/100 mL/min, the in-chamber pressure: 6.7 Pa, the microwave generation unit power: 3.4 kW, the wafer temperature: 400° C., the chamber wall temperature: 45° C., and the process time: 110 seconds. Then, the first sampling wafer thus processed was unloaded, and the W concentration on the surface was measured. As a result, it was confirmed that the W concentration was not more than the detection limit of $3 \times 10^8$ atoms/cm$^2$, and thus the state was W-free (clean). At this time, the W concentration was measured by the TXRF described above (this matter will be the same in the following explanation). This value was used as a reference of the W concentration for the chamber.

Then, an Si wafer having a W film formed on the surface was placed on the susceptor, and an oxidation process was performed under the same conditions as those described above except that the process time was set at two minutes, so as to contaminate the interior of the chamber. This time period approximately corresponds to a time period used for processing five device wafers. After this process, the Si wafer having the W film was unloaded, and a second bare Si wafer for sampling was placed on the susceptor, and an oxidation process was performed under the same conditions as those for the first wafer. Then, the second sampling wafer thus processed was unloaded, and the W concentration on the surface was measured. As a result, the W concentration on the wafer surface was about $4 \times 10^{10}$ atoms/cm$^2$, which was higher than the former value.

Then, Ar/$O_2$ gas plasma cleaning was performed under the following conditions. Specifically, in this cleaning process, the gas flow rate: Ar/$O_2$=1,000/300 mL/min, the in-chamber pressure: 6.7 Pa, the microwave generation unit power: 3.4 kW, the susceptor temperature: 400° C., and the process time: 180 seconds. After this process, a third bare Si wafer for sampling was placed on the susceptor, and an oxidation process was performed under the same conditions as those for the first sampling wafer. Then, the third sampling wafer thus processed was unloaded, and the W concentration on the surface was measured. As a result, the W concentration on the wafer surface was about $1.3 \times 10^{11}$ atoms/cm$^2$. Thereafter, until the ordinal number of a sampling wafer reached thirteenth, the sequential operations described above were repeated. Specifically, for each of 11 wafers, a cleaning process was performed as described above, then an oxidation process was performed under the same conditions as those for the first sampling wafer, and then the W concentration was measured.

Figure 6:
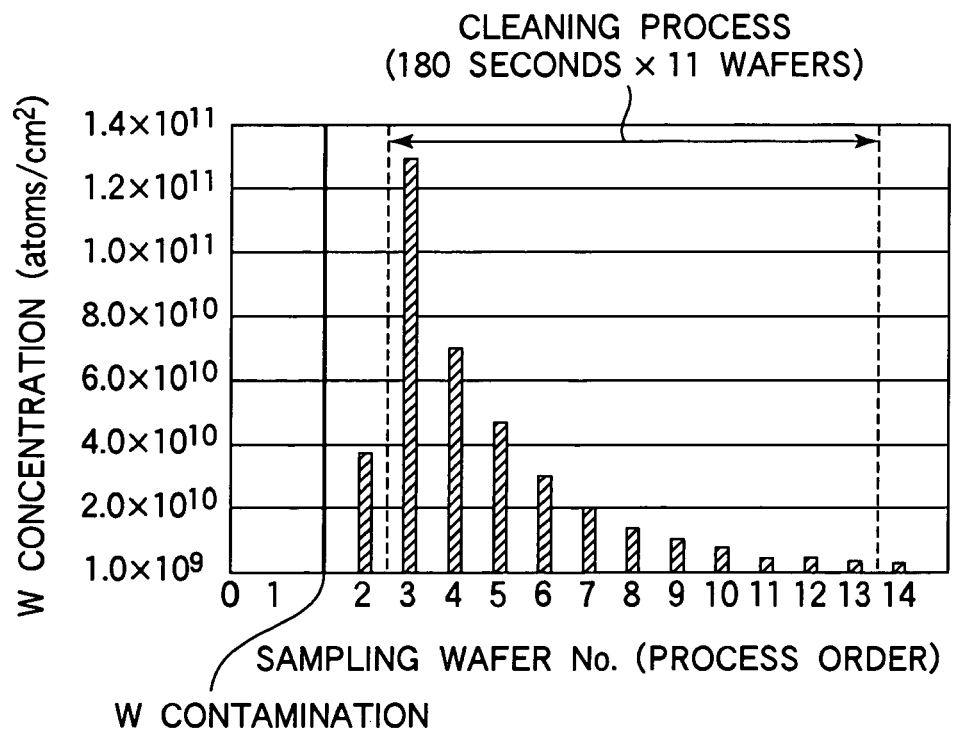
FIG. 6 is a view showing an effect obtained when a cleaning method according to the present invention was performed.

At the end, a fourteenth bare Si wafer for sampling was placed on the susceptor, and an oxidation process was performed under the same conditions as those for the first sampling wafer. Then, the fourteenth sampling wafer thus processed was unloaded, and the W concentration on the surface was measured. FIG. 6 shows results of this set of experiments.

FIG. 6 is a view showing an effect obtained when cleaning according to the present invention was performed, wherein the horizontal axis denotes the wafer number (process order) and the vertical axis denotes the W concentration on the wafer surface. As shown in FIG. 6, it was confirmed that the W concentration became $1 \times 10^{10}$ atoms/cm$^2$ or less, where the cleaning process for three minutes was repeated for each of 10 or less wafers, i.e., before the total cleaning time reached 30 minutes. Specifically, it was confirmed that the W concentration was decreased to $1 \times 10^{10}$ atoms/cm$^2$ or less by a total cleaning time of 21 minutes or more and preferably 27 minutes or more.

Figure 7:
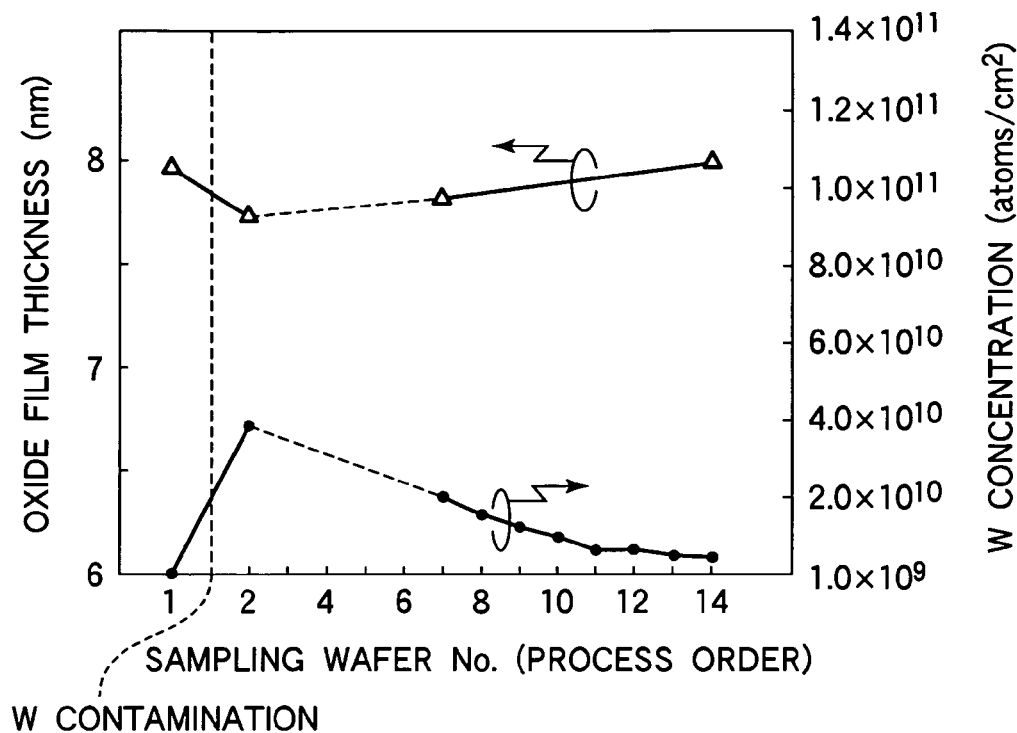
FIG. 7 is a view showing a change in oxide film thickness and a change in W concentration, obtained when the cleaning method of FIG. 6 was performed.

Further, a selective oxidation process was performed on each of sampling wafers, and the thickness of an oxide film thereby formed was measured. FIG. 7 shows the oxide film thickness on the sampling wafers obtained at this time. FIG. 7 also shows the plot of the W concentration in addition to the oxide film thickness. As shown in FIG. 7, where the process was performed for 110 seconds, the oxide film thickness on the first sampling wafer was 7.99 nm. The oxide film thickness on the second wafer obtained by the process for 110 seconds was 7.75 nm, which was thinner because the polysilicon oxidation was hindered by W contamination. However, thereafter, with a decrease in the W concentration due to cleaning of the chamber, the oxide film thickness was gradually recovered, and the oxide film thickness on the last fourteenth wafer was 8.03 nm. It was thus confirmed that the inhibition of oxidation by W contamination had been solved. As could be understood from the results described above, the W contamination quantity (W concentration) has a strong correlation with the oxide film thickness. Accordingly, it is possible to find the cleaning end point on the basis of the oxide film thickness.

Next, an actual cleaning test was performed, using various conditions.

In this test, cleaning of the chamber of an apparatus having the structure shown in FIG. 1 was first performed to set the chamber in a W-free state, as in the test described above. Then, seasoning inside the chamber was performed. Thereafter, a first bare Si wafer for sampling was placed on the susceptor, and an oxidation process was performed, as in the test described above. Then, the first wafer thus processed was unloaded, and the W concentration on the surface was measured. As a result, it was confirmed that the W concentration was not more than the detection limit.

Then, an Si wafer having a W film formed on the surface was placed on the susceptor, and an oxidation process was performed under the same conditions as those of the test described above for 10 minutes, so as to contaminate the interior of the chamber with W. This time period approximately corresponds to one lot of device wafers (25 wafers). Then, the wafer having the W film was unloaded, and a second bare Si wafer for sampling was placed on the susceptor, and an oxidation process was performed under the same conditions as those for the first wafer. Then, the second sampling wafer thus processed was unloaded, and the W concentration on the surface was measured. As a result, the W concentration on the wafer surface took on a high value on the order of $10^{12}$ atoms/cm$^2$.

Then, plasma cleaning using Ar/O$_2$/H$_2$ gas was performed under the following conditions. Specifically, in this cleaning process, the gas flow rate ratio, in-chamber pressure, and chamber temperature (susceptor temperature) were set at various values, while the process time was set at 180 seconds. After this process, a third bare Si wafer for sampling was placed on the susceptor, and an oxidation process was performed under the same conditions as those for the first sampling wafer. Then, the third sampling wafer thus processed was unloaded, and the W concentration on the surface was measured. Thereafter, until the ordinal number of a sampling wafer reached thirteenth, the sequential operations described above were repeated. Specifically, for each of 11 wafers, a cleaning process was performed as described above, then an oxidation process was performed under the same conditions as those for the first sampling wafer, and then the W concentration was measured.

At the end, a fourteenth bare Si wafer for sampling was placed on the susceptor, and an oxidation process was performed under the same conditions as those for the first wafer. Then, the fourteenth wafer thus processed was unloaded, and the W concentration on the surface was measured.

Figure 8:
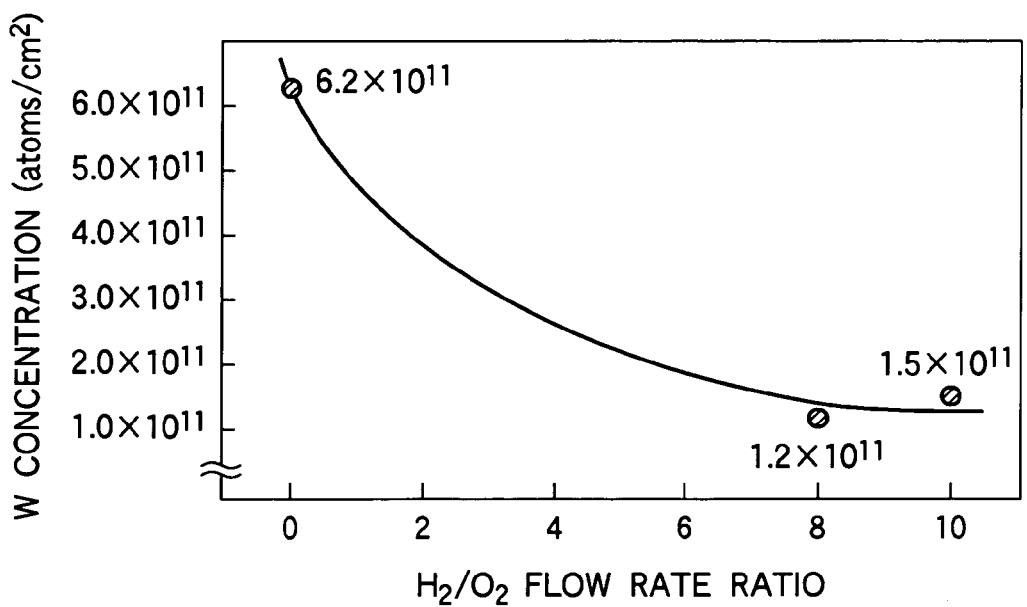
FIG. 8 is a view showing a cleaning effect obtained when a cleaning method according to the present invention was performed with various values of $H_2/O_2$ ratio.

As cleaning process conditions used at this time, the susceptor temperature was set at 400° C., the in-chamber pressure was set at 6.7 Pa, and the H$_2$/O$_2$ flow ratio was set at different values of 0 (Ar/O$_2$/H$_2$=1,000:300:0 mL/min), 8 (Ar/O$_2$/H$_2$=1,000:50:400 mL/min), and 10 (Ar/O$_2$/H$_2$=700:50:500 mL/min). The cleaning process was thus performed, then an oxidation process was performed, and the W concentration on the surface of each sampling wafer was measured. FIG. 8 shows a result of this experiment.

As shown in FIG. 8, the measurement value of W concentration became lower with an increase in the flow rate ratio of H$_2$ gas relative to O$_2$ gas until the flow rate ratio (H$_2$/O$_2$ ratio) reached 10. Where this value was 2 or more, a relatively good cleaning effect was obtained. The W concentration was lowest when the H$_2$/O$_2$ ratio was 8, and, thereafter, the cleaning effect was saturated. It has been confirmed from this result that the H$_2$/O$_2$ ratio is preferably set to be 4 or more, and more preferably 6 or more.

Figure 9:
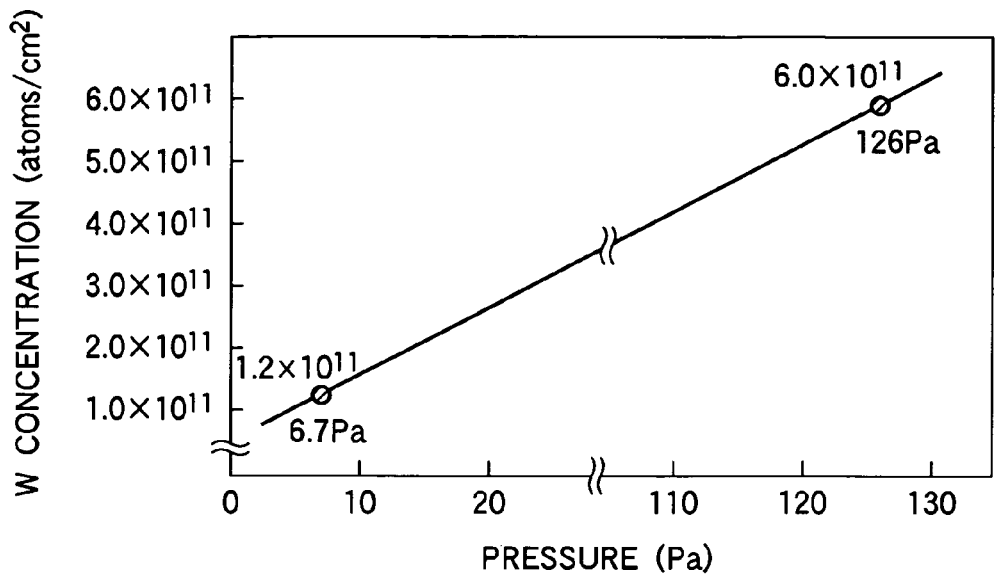
FIG. 9 is a view showing a cleaning effect obtained when a cleaning method according to the present invention was performed with various values of in-chamber pressure.

Next, the cleaning process described above was performed while the susceptor temperature was set at 400° C., the gas composition was set at Ar/O$_2$/H$_2$=1,000:50:400 mL/min, and the in-chamber pressure was set at different values of 6.7 Pa and 126 Pa. Then, an oxidation process was performed, and the W concentration on the surface of each sampling wafer was measured. FIG. 9 shows a result of this experiment.

As shown in FIG. 9, the measurement value of W concentration was lower as the in-chamber pressure was lower, i.e., 6.7 Pa, than that obtained when the pressure was 126 Pa. It has been confirmed from this result that the cleaning effect becomes higher with a decrease in the in-chamber pressure. It is thought that this was caused by the vapor pressure of W compounds being higher.

Figure 10:
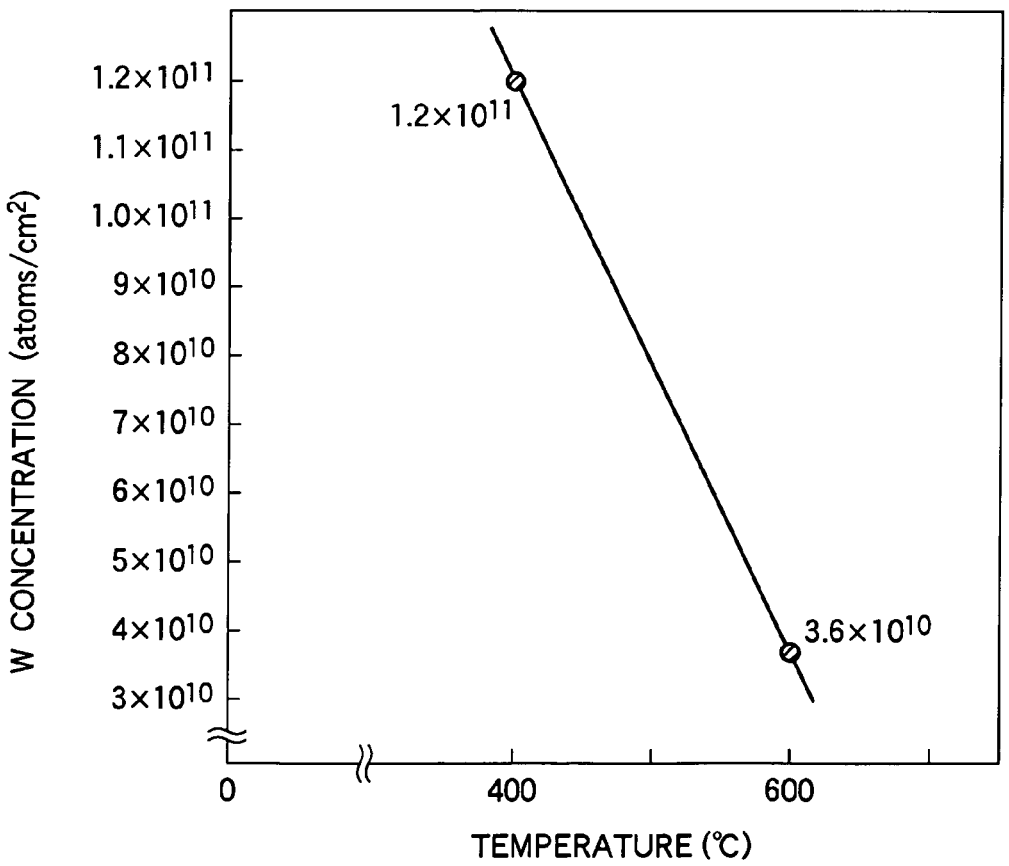
FIG. 10 is a view showing a cleaning effect obtained when a cleaning method according to the present invention was performed with various values of chamber wall temperature (susceptor temperature).

Next, the cleaning process described above was performed while the gas composition was set at $Ar/O_2/H_2 = 1,000:50:400$ mL/min, the in-chamber pressure was set at 6.7 Pa, and the susceptor temperature was set at different values of 400° C. and 600° C. Then, the W concentration on the surface was measured. FIG. 10 shows a result of this experiment.

As shown in FIG. 10, the measurement value of W concentration was lower as the susceptor temperature was higher. When the temperature was 600° C., the W concentration was $3.6 \times 10^{10}$ atoms/cm$^2$, which was the lowest value among adopted conditions. It is thought that this was also caused by the vapor pressure of W compounds being higher, as in the case where the pressure was changed.

Further, the oxide film thickness on the fourteenth wafer was 8.1 nm, which was equivalent to the initial value. It was thus confirmed that the inhibition of oxidation by W contamination had been solved.

Next, an explanation will be given of a second embodiment according to the present invention.

Figure 11:
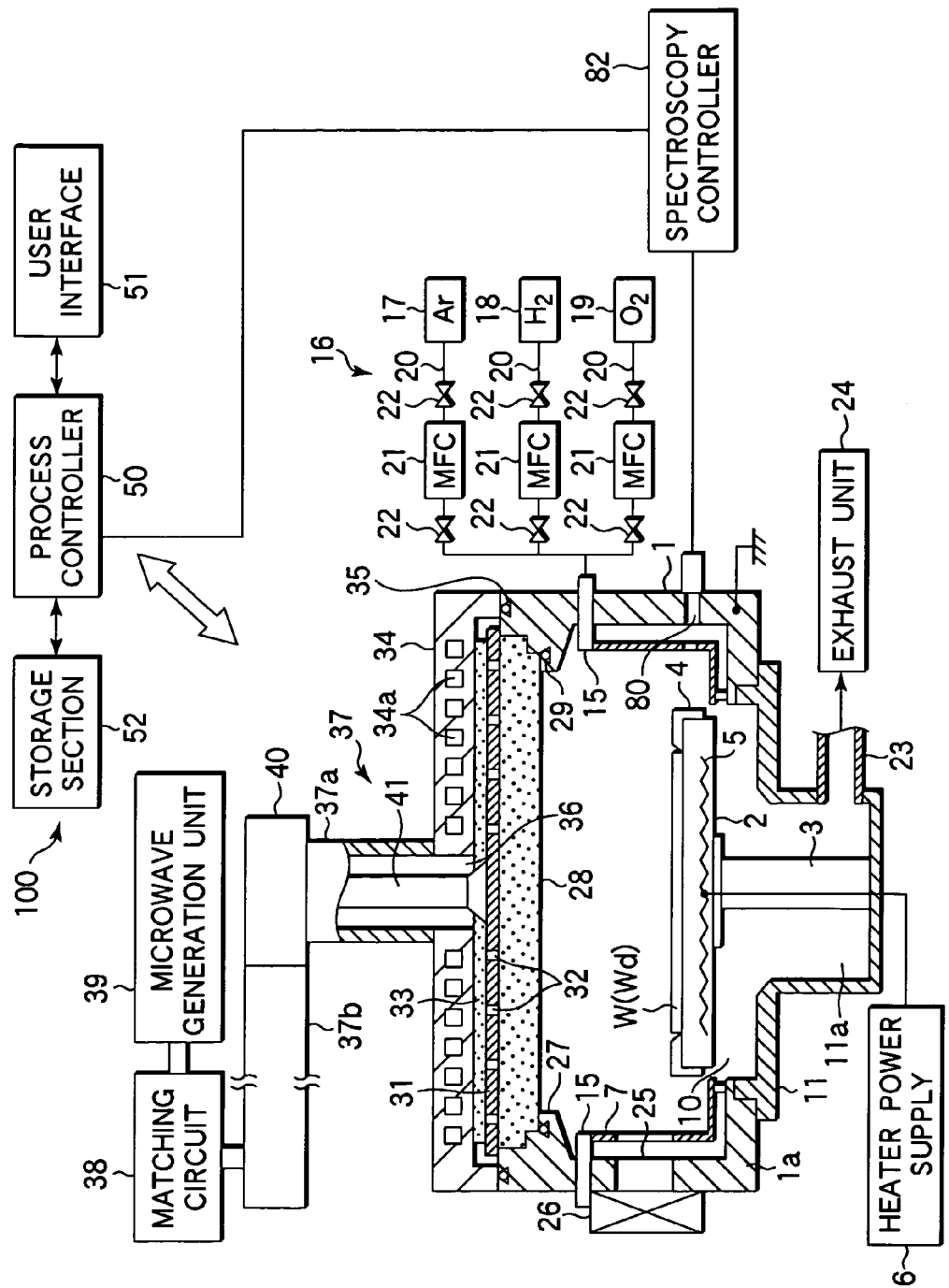
FIG. 11 is a sectional view schematically showing an example of a plasma processing apparatus to be subjected to a process chamber cleaning method according to a second embodiment of the present invention.

FIG. 11 is a sectional view schematically showing an example of a plasma processing apparatus to be subjected to a process chamber cleaning method according to a second embodiment of the present invention.

This plasma processing apparatus 200 include an end point detecting function in addition to the plasma processing apparatus shown in FIG. 1. In FIG. 11, the same constituent elements as those in FIG. 1 are denoted by the same reference numerals, and the explanation thereof will be omitted.

This plasma processing apparatus 200 includes a translucent window 80 used for detecting the cleaning end point, in a lower portion of the sidewall of a chamber 1. A light receiver 81 is disposed adjacent to this window 80 and is electrically connected to a spectroscopy controller 82, such as a monochrometer, for measuring plasma emission intensity. The window 80 is located distant from the planar antenna member 31, so that it is less affected by plasma. Further, the window 80 is located out of the exhaust passage, so that it can perform stable measurement while less suffering deposits thereon. The location of the spectroscopy controller 82 is not limited to a specific one, and it can be disposed at any place as long as it can perform stable measurement. The chamber 1 is provided with the cylindrical liner 7 made of quartz, so the emission intensity of radicals in plasma is measured through the liner 7 as well as the window 80. An opening may be formed in the liner 7, but no opening is preferably formed to prevent the window 80 from suffering deposits thereon.

The process controller 50 is electrically connected to the spectroscopy controller 82 through an interconnection line 53 to analyze information on the emission intensity of, e.g., H* radicals detected by the spectroscopy controller 82, so as to determine the cleaning end point, in addition to the functions described above. Then, for example, cleaning is automatically stopped and the termination of cleaning is displayed on a display of a user interface 51, in accordance with an instruction from the process controller 50.

In the plasma processing apparatus 200 thus arranged, a selective oxidation process of a gate electrode is performed, as in the first embodiment. Then, the chamber 1 contaminated by $WO_x$ sublimation is subjected to plasma dry cleaning without being opened to the atmosphere. In this embodiment, a hydrogen-containing gas is indispensable as a cleaning gas.

Specifically, the cleaning process is performed in accordance with FIGS. 4A to 4D, as described above. After the selective oxidation process, at first, as shown in FIG. 4A, the gate valve 26 is opened while the chamber 1 is not opened to the atmosphere. Then, a clean dummy wafer Wd is transferred by a transfer unit 71 from a transfer chamber 70 held in a vacuum state through the transfer port 25 into the chamber 1, and placed on the susceptor 2, as needed. Then, as shown in FIG. 4B, while the interior of the chamber 1 is exhausted, a cleaning gas of $Ar/H_2/O_2$ is supplied from the gas supply system 16 into the chamber 1. Then, as shown in FIG. 4C, microwaves are supplied from the microwave generation unit 39 into the chamber 1, as in the selective oxidation process of the poly-silicon sidewall surface, to turn the cleaning gas into plasma. At this time, as shown in FIG. 4D, the interior of the chamber 1 is cleaned by the plasma, as in the first embodiment.

During this cleaning process, the pressure inside the chamber 1 is set to be, e.g., 3 to 1,333 Pa. The temperature inside the chamber 1, for example, the temperature of the chamber wall is preferably set to be 45° C. or more. Further, the temperature of the susceptor 2 is preferably higher, and is more preferably set to be about 400 to 800° C. During the cleaning, the chamber 1 may be continuously exhausted, but the chamber 1 is preferably intermittently exhausted. Further, it is effective to supply a purge gas while exhausting the chamber 1.

The cleaning gas supplied may be formed of, e.g., $H_2$ gas+Ar gas, but it is preferably formed of $O_2$ gas +$H_2$ gas+Ar gas. Where a suitable amount of $H_2$ gas is added to the cleaning gas, the cleaning effect can be improved. Where the gas is formed of $O_2$ gas+$H_2$ gas+Ar gas, the flow rate is preferably set such that $O_2$ gas: 10 to 500 mL/min, Ar gas: 200 to 2,000 mL/min, and $H_2$ gas: 40 to 2,000 mL/min. The flow rate ratio of $H_2$ gas relative to $O_2$ gas is set to be 2 or more to enhance the cleaning effect. This ratio is preferably set to be 4 or more, and more preferably 6 or more. Where supply of $O_2$ gas+Ar gas and supply of $O_2$ gas+$H_2$ gas+Ar gas are alternately repeated, e.g., $H_2$ gas is intermittently added to supply of $O_2$ gas+Ar gas, the cleaning effect is further improved. Further, where cleaning gas supply and one of vacuum-exhaust and vacuum-exhaust with purge gas supply are alternately repeated, the cleaning effect is further improved. Furthermore, it is preferable that the apparatus shown in FIG. 11 is provided with a line for supplying He gas or Ne gas into the chamber 1, and plasma of He gas or Ne gas is generated within the chamber immediately before the cleaning condition plasma is generated. In this case, the temperature of the wall surface of the chamber 1 is increased by plasma heating in advance, so $WO_x$ can be more easily sublimated and the cleaning efficiency is thereby improved. The power of the microwave generation unit 39 is preferably set to be 1.0 to 5.0 kW.

During the cleaning, the emission intensity of radicals in plasma is measured by the spectroscopy controller 82. In the spectroscopy controller 82, light emitted from plasma and detected by the light receiver 81 is divided into spectra. Being selected from the emission spectra of radicals measured by the spectroscopy controller 82, the emission intensity of radicals that increase with progress of the cleaning, such as hydrogen radicals H* having a wavelength of 656 nm, is measured and monitored. In this embodiment, the time point when the emission intensity of H* returns approximately to the initial state (a state before being contaminated with W) is considered to correspond to the cleaning end point. Alternatively, where a graph of the emission intensity of H* along with time is formed, the cleaning end point can be determined on the basis of the change rate of the intensity (for example, the inclination of tangent lines set in the emission intensity graph).

The mechanism is not yet clear as to why the cleaning end point can be detected by the emission intensity of hydrogen radicals. However, the following explanation may be rational.

In general, it is thought that tungsten contaminating the interior of a chamber is deposited as an oxide ($WO_x$) on the chamber wall and so forth. Since H* in cleaning gas plasma is used for deoxidizing $WO_x$, the consumption amount of H* is decreased with a decrease in the amount of residual $WO_x$ along with progress of the cleaning. Accordingly, it is thought that the emission intensity of H* is recovered along with progress of the cleaning, and, when no residual $WO_x$ is present any more, the emission intensity of H* returns approximately to the initial state (a state before contamination).

As described above, according to this embodiment, the emission intensity of H* is monitored, while the chamber 1 is subjected to cleaning using plasma without being opened to the atmosphere. Consequently, the cleaning end point can be accurately and reliably detected, so no problem arises due to insufficient or excessive cleaning. This is advantageous, as compared to the conventional cleaning method that determines the cleaning end point by time management. Further, there is no need to confirm the cleaning end point with much expense in time and cost by, e.g., using an ICP-MS (Inductive Coupling Plasma Mass Spectrometer) or a TXRF (Total Reflection X-Ray Fluorescence). Furthermore, where the emission intensity of H* is monitored, it is possible to know when contamination is caused by an abnormal situation in the chamber.

Next, an explanation will be given of an experiment conducted to confirm effects of this embodiment.

In the plasma processing apparatus 200 shown in FIG. 11, in-situ cleaning of the chamber contaminated with W was performed using RLSA plasma, and H* light emission was monitored. In this test, the cleaning was performed while the cleaning gas was formed of a mixture gas of $Ar/H_2/O_2$ with a flow rate ratio of $Ar/H_2/O_2=1,000/400/50$ mL/min, the in-chamber pressure was set at 6.7 Pa (50 mT), the microwave generation unit power was set at 3.4 kW, the temperature of the susceptor 2 was set at 400° C., and the chamber wall temperature was set at 45° C.

At first, a clean bare Si wafer for sampling (sampling wafer No. 1) was loaded into the chamber having no contamination with W, and a plasma process was performed under selective oxidation process conditions to prepare an initial sample. At this time, an oxide film was formed to have a film thickness of 8 nm under the selective oxidation process conditions, in which the process gas was formed of a mixture gas of $Ar/H_2/O_2$ with a flow rate ratio of $Ar/H_2/O_2=1,000/200/100$ mL/min, the in-chamber pressure was set at 6.7 Pa (50 mT), the microwave generation unit power was set at 3.4 kW, the temperature of the susceptor 2 was set at 400° C., and the chamber wall temperature was set at 45° C.

After the sampling wafer No. 1 was unload from the chamber 1, a clean bare Si wafer for sampling (sampling wafer No. 2) was loaded, and a plasma process was performed under the same selective oxidation process conditions. Then, the sampling wafer No. 2 thus subjected to the selective oxidation process was unloaded from the chamber. Thereafter, a W-blanketed wafer, the entire surface of which was covered with tungsten (W) having a thickness of about 60 nm and formed by vapor deposition, was loaded, and an oxidation process was performed, so as to forcibly contaminate the interior of the chamber with tungsten (W).

Then, the W-contamination wafer was unload from the chamber 1, and a clean bare Si wafer for sampling (sampling wafer No. 3) was loaded, and a plasma process was performed under the selective oxidation process conditions described above to form a monitor sample.

After the sampling wafer No. 3 was unload from the chamber, plasma cleaning was performed under the cleaning conditions described above. After this process, a clean bare Si wafer for sampling (sampling wafer No. 4) was loaded, and a selective oxidation process is performed under the same conditions as those for the sampling wafer No. 1. Thereafter, the following operations were repeated for each of 11 bare Si wafers for sampling (sampling wafer Nos. 5 to 15), such that a cleaning process was performed as described above, then a selective oxidation process was performed under the same conditions as those for the sampling wafer No. 1.

Figure 12:
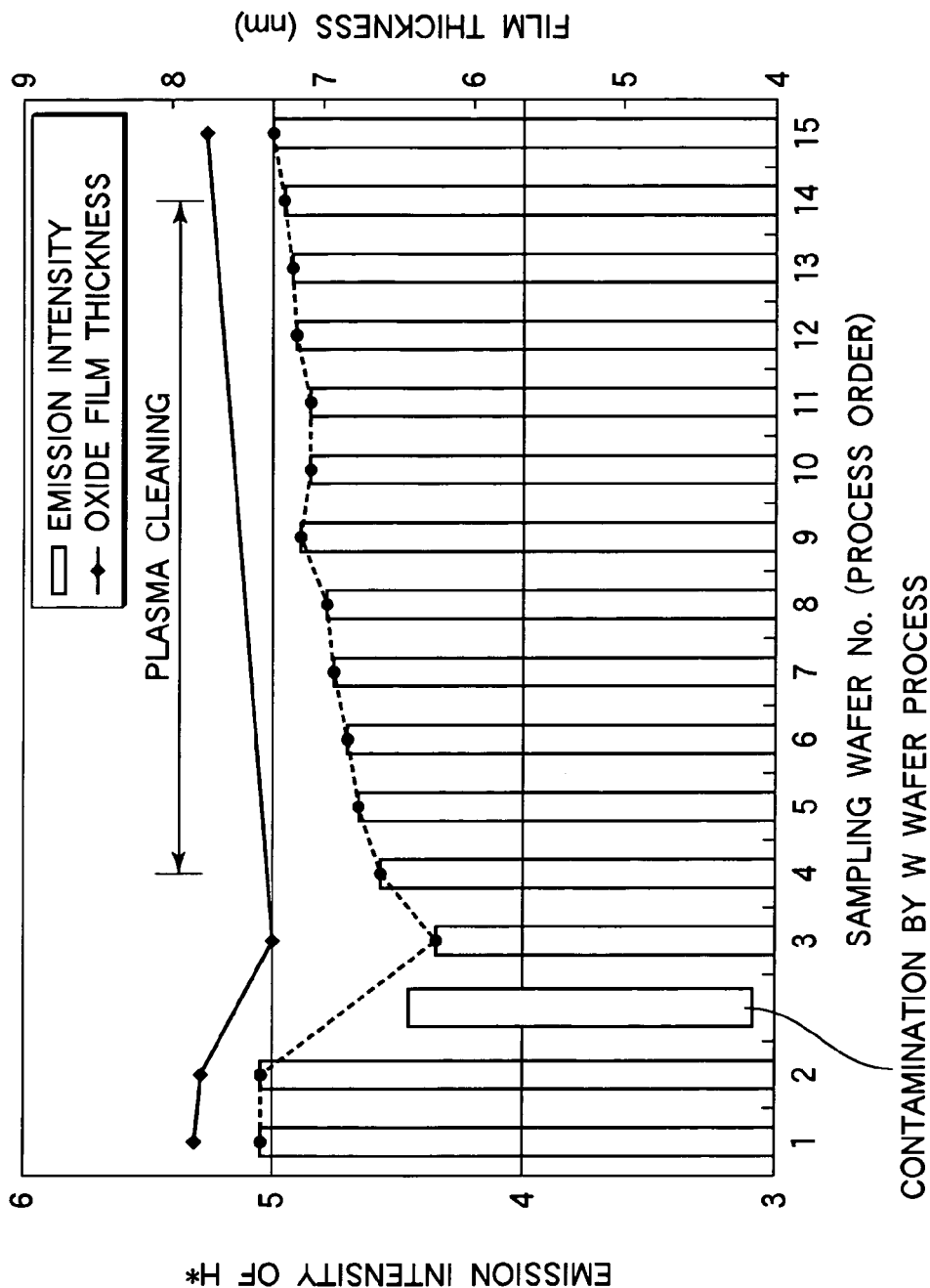
FIG. 12 is a graph showing a change in emission intensity and a change in film thickness, depending on the process order of sampling wafers when cleaning was performed.

During the selective oxidation process for each of the sampling wafers described above, the wavelength of H* was monitored by a monochrometor. Then, the emission intensity of H* obtained before the W-contamination wafer was processed was compared with the emission intensity of H* (wavelength: 656 nm) after the dry cleaning was performed. FIG. 12 shows a result of this experiment. FIG. 12 shows the emission intensity obtained when the selective oxidation process was performed on each of wafers of sampling wafer Nos. 1 to 15 in the chamber 1, and the film thickness obtained on bare Si by the selective oxidation process performed before and after the cleaning process. As shown in FIG. 12, along with an increased in the number of processed bare Si wafers, i.e., with the progress of cleaning, the emission intensity of H* was recovered. After this process, a bare Si wafer for sampling (sampling wafer No. 16) was unload, and the W contamination quantity on the surface was measured by a TXRF (Total Reflection X-Ray Fluorescence). As a result, it was confirmed that no tungsten (W) was detected, and thus the cleaning was completed.

Further, the oxide film thickness on each of the sampling wafers obtained by the selective oxidation process was measured. As a result, the sampling wafer No. 1 rendered an oxide film thickness of 7.85 nm by the process for 210 seconds. The sampling wafer No. 3 rendered a thinner oxide film thickness of 7.3 nm by the process for 210 seconds, because polysilicon oxidation was hindered by W contamination. On the other hand, the sampling wafer No. 15 rendered an oxide film thickness of 7.7 nm. Accordingly, it was confirmed that, when the cleaning inside the chamber was completed and the W contamination therein was solved, the oxidation inhibition by W contamination was not caused.

Figure 13:
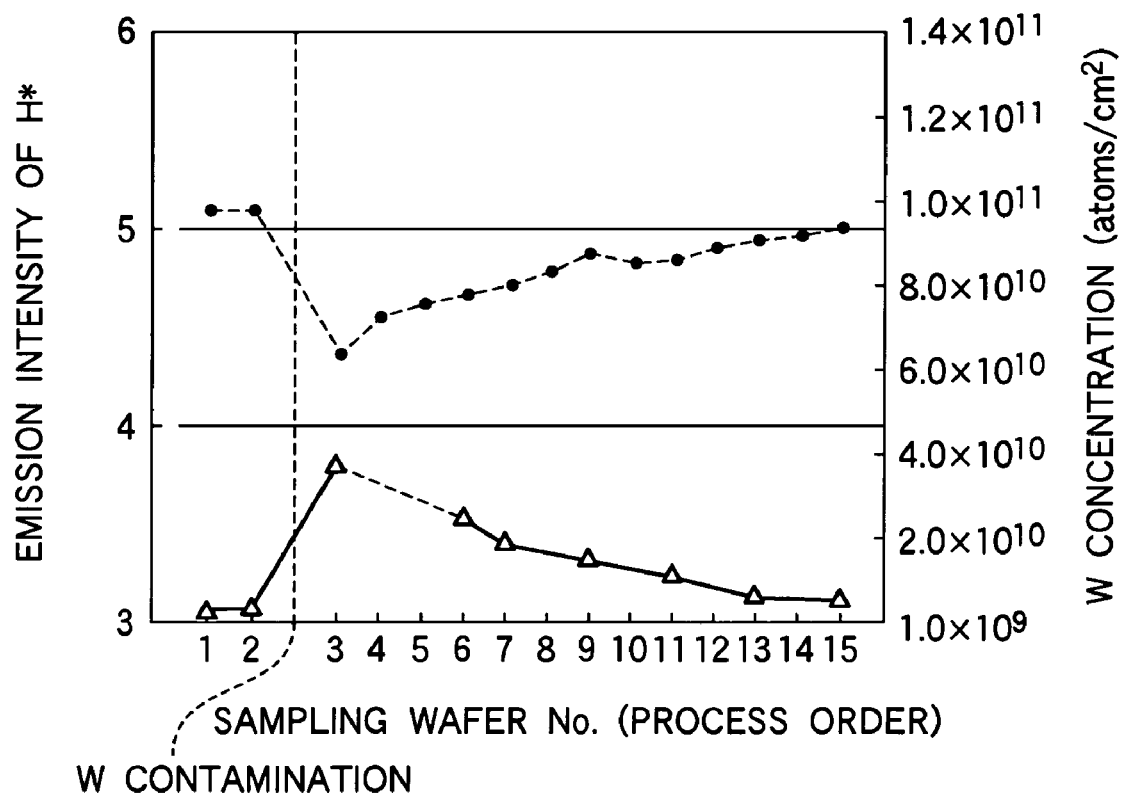
FIG. 13 is a graph showing a change in emission intensity and a change in W concentration, depending on the process order of sampling wafers when cleaning was performed.

As shown in FIG. 7, the oxide film thickness obtained by the selective oxidation process has a strong correlation with the W contamination degree (W concentration). Accordingly, it is possible to know the W contamination degree (W concentration) by monitoring the emission intensity of H*. In this case, the relationship between the emission intensity of H* and the W contamination degree (W concentration) is made as shown in FIG. 13, for example.

The present invention is not limited to the embodiments described above, and it may be modified in various manners. For example, in the embodiments described above, the processing apparatus is formed of a plasma processing apparatus in which microwaves are transmitted into a chamber through a planar antenna having a plurality of slots, to generate plasma with a high density at a low electron temperature. An alternative thereto may be an apparatus having a planar antenna of another type, such as a plasma processing apparatus of the reflection wave type. Further, a plasma processing apparatus of the inductive coupling type may be used to generate plasma while utilizing an inductive electric field generated through a dielectric material by a radio frequency power applied to an antenna. Also in this case, high density plasma can be generated. However, the processing apparatus is not limited to these examples, and it may be formed of another plasma processing apparatus using plasma generated by, e.g., the capacitive coupling type or magnetron type, or a processing apparatus other than the plasma process type, as long as a container (chamber) suffers metal contamination. Furthermore, microwaves are transmitted into a chamber through a planar antenna having a plurality of slots, to generate plasma and thereby perform a cleaning process, but this is not limiting. For example, as described above, plasma generated by a planar antenna of another type or plasma generated by the inductive coupling type may be preferably used, or plasma generated by the capacitive coupling type or plasma generated by another type may be used. In the embodiments described above, metal is exemplified by W, but it may be a metal other than W, such as Co, Ni, Ba, Sr, Ti, Hf, Zr, Ru, or Cu. Furthermore, measurement is performed on the light emission of hydrogen radicals, for example, but it may be applied to another gas, as long as the light emission of its radicals can be measured.

In the first embodiment, the cleaning gas is exemplified by $O_2$ gas alone, $O_2$ gas+Ar gas, or $O_2$ gas+$H_2$ gas+Ar gas, but the cleaning gas is not limited to these examples, as long as it contains $O_2$ gas. Ar gas contained in the combinations described above may be replaced with another inactive gas (He, Ne, Kr, or Xe).

In the second embodiment, the cleaning gas is exemplified by $H_2$ gas+Ar gas or $O_2$ gas+$H_2$ gas+Ar gas, and the cleaning end point is detected by measuring the emission intensity of hydrogen radicals H*, which increase with progress of cleaning, but these matters are not limiting. Ar gas contained in the combinations described above may be replaced with another inactive gas (He, Ne, Kr, or Xe).

The invention claimed is:

1. A process chamber cleaning method for cleaning a process chamber of a substrate processing apparatus, the method starting a cleaning process without setting the process chamber opened to the atmosphere after performing an oxidization process on a substrate including a film containing a metal inside the process chamber and thereby contaminating the process chamber with a metal oxide of the metal, and the method performing the cleaning process while exhausting gas from inside the process chamber such that the cleaning process comprises:
   supplying a cleaning gas into the process chamber, the cleaning gas consisting of $O_2$ gas and $H_2$ gas and an inactive gas or consisting of $O_2$ gas and $H_2$ gas with a ratio of the $H_2$ gas relative to the $O_2$ gas set at 2 or more;
   generating plasma of the cleaning gas inside the process chamber;
   applying the plasma to the metal oxide to sublimate the metal oxide; and
   removing the sublimated metal oxide thus generated from inside the process chamber along with gas being exhausted.

2. The process chamber cleaning method according to claim 1, wherein the metal is tungsten and the oxidization process is a selective oxidization process for selectively oxidizing a silicon film on the substrate.

3. The process chamber cleaning method according to claim 1, wherein the oxidization process is performed while generating plasma of an oxidizing gas, and each of the plasma of the oxidizing gas and the plasma of the cleaning gas is generated by microwaves supplied into the process chamber through a planar antenna having a plurality of slots.

4. The process chamber cleaning method according to claim 1, wherein the cleaning gas has a ratio of $H_2$ gas relative to $O_2$ gas set at 4 or more.

5. The process chamber cleaning method according to claim 1, wherein the method further comprises heating the process chamber by plasma before starting the cleaning process.

6. The process chamber cleaning method according to claim 1, wherein the cleaning process is performed while pressure inside the process chamber is set to be less than 126 Pa.

7. The process chamber cleaning method according to claim 1, wherein the cleaning process is performed while temperature inside the process chamber is set to be about 400 to 800° C.

8. The process chamber cleaning method according to claim 1, wherein the cleaning gas is supplied while the $O_2$ gas is set at a flow rate of 10 to 500 mL/min and the $H_2$ gas is set at a flow rate of 40 to 2,000 mL/min.

9. The process chamber cleaning method according to claim 8, wherein the cleaning gas is supplied while the inactive gas consisting of Ar is set at a flow rate of 200 to 2000 mL/min.

10. A process chamber cleaning method for cleaning a process chamber of a substrate processing apparatus, the method starting a cleaning process without setting the process chamber opened to the atmosphere after performing a plasma oxidization process on a substrate having a laminated film including a tungsten-containing film and a poly-silicon film to selectively oxidize the poly-silicon film inside the process chamber and thereby contaminating the process chamber with tungsten oxide, and the method performing the cleaning process while exhausting gas from inside the process chamber such that the cleaning process, the method comprising:
    supplying a cleaning gas into the process chamber, the cleaning gas consisting of $O_2$ gas and $H_2$ gas and an inactive gas or consisting of $O_2$ gas and $H_2$ gas with a ratio of the $H_2$ gas relative to the $O_2$ gas set at 2 or more;
    generating plasma of the cleaning gas inside the process chamber;
    applying the plasma to the tungsten oxide to sublimate the tungsten oxide; and
    removing the sublimated tungsten oxide thus generated from inside the process chamber along with gas being exhausted.

11. The process chamber cleaning method according to claim 10, wherein each of plasma used in the plasma oxidization process and the plasma of the cleaning gas is generated by microwaves supplied into the process chamber through a planar antenna having a plurality of slots.

12. The process chamber cleaning method according to claim 10, wherein the cleaning gas has a ratio of $H_2$ gas relative to $O_2$ gas set at 4 or more.

13. The process chamber cleaning method according to claim 10, wherein the cleaning process is performed while temperature inside the process chamber is set to be about 400 to 800° C.

14. The process chamber cleaning method according to claim 10, wherein the cleaning process is performed while pressure inside the process chamber is set to be less than 126 Pa.

15. The process chamber cleaning method according to claim 10, wherein the cleaning gas is supplied while the $O_2$ gas is set at a flow rate of 10 to 500 mL/min and the $H_2$ gas is set at a flow rate of 40 to 2,000 mL/min.

16. The process chamber cleaning method according to claim 15, wherein the cleaning gas is supplied while the inactive gas consisting of Ar is set at a flow rate of 200 to 2000 mL/min.

17. A substrate processing method comprising:
performing a plasma oxidization process on a first substrate having a first laminated film including a first tungsten-containing film and a first poly-silicon film to selectively oxidize the first poly-silicon film inside a process chamber of a substrate processing apparatus;
performing a cleaning process inside the process chamber without the first substrate placed therein while exhausting gas from inside the process to remove tungsten oxide with which the process chamber is contaminated, the cleaning process being started without setting the process chamber opened to the atmosphere after the plasma oxidization process, the cleaning process including,
supplying a cleaning gas into the process chamber, the cleaning gas consisting of $O_2$ gas and $H_2$ gas and an inactive gas or consisting of $O_2$ gas and $H_2$ gas with a ratio of the $H_2$ gas relative to the $O_2$ gas set at 2 or more,
generating plasma of the cleaning gas inside the process chamber,
applying the plasma to the tungsten oxide to sublimate the tungsten oxide, and
removing the sublimated tungsten oxide thus generated from inside the process chamber along with gas being exhausted; and
performing the plasma oxidation process on a second substrate having a second laminated film including a second tungsten-containing film and a second poly-silicon film to selectively oxidize the second poly-silicon film inside the process chamber after the cleaning process.

18. The substrate processing method according to claim 17, wherein each of plasma used in the plasma oxidization process and the plasma of the cleaning gas is generated by an inductive coupling type, plasma generated by a parallel-plate type, plasma generated by a planar antenna type, reflection wave plasma, or magnetron plasma.

19. The substrate processing method according to claim 17, wherein each of plasma used in the plasma oxidization process and the plasma of the cleaning gas is generated by microwaves supplied into the process chamber through a planar antenna having a plurality of slots.

20. The substrate processing method according to claim 17, wherein the cleaning gas has a ratio of $H_2$ gas relative to $O_2$ gas set at 4 or more.

21. The substrate processing method according to claim 17, the method further comprises seasoning the process chamber under the same conditions as the plasma oxidization process after the cleaning process and before the plasma oxidization process on the second substrate.

22. The substrate processing method according to claim 17, wherein the cleaning process is performed while pressure inside the process chamber is set to be less than 126 Pa.

23. The substrate processing method according to claim 17, wherein the cleaning process is performed while temperature inside the process chamber is set to be about 400 to 800° C.

24. The substrate processing method according to claim 17, wherein the cleaning gas is supplied while the $O_2$ gas is set at a flow rate of 10 to 500 mL/min and the $H_2$ gas is set at a flow rate of 40 to 2,000 mL/min.

25. The substrate processing method according to claim 24, wherein the cleaning gas is supplied while the inactive gas consisting of Ar is set at a flow rate of 200 to 2000 mL/min.

* * * * *